US010559366B2

(12) United States Patent
Shen et al.

(10) Patent No.: US 10,559,366 B2
(45) Date of Patent: Feb. 11, 2020

(54) BOUNDARY WORD LINE VOLTAGE SHIFT

(71) Applicant: Western Digital Technologies, Inc., San Jose, CA (US)

(72) Inventors: Zhenlei Shen, Milpitas, CA (US); Pitamber Shukla, Milpitas, CA (US); Philip Reusswig, Mountain View, CA (US); Niles N. Yang, Mountain View, CA (US); Anubhav Khandelwal, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/941,747

(22) Filed: Mar. 30, 2018

(65) Prior Publication Data

US 2019/0304550 A1 Oct. 3, 2019

(51) Int. Cl.
G11C 16/34 (2006.01)
G11C 16/04 (2006.01)
G11C 16/16 (2006.01)
G11C 29/50 (2006.01)
G11C 16/26 (2006.01)

(52) U.S. Cl.
CPC .......... *G11C 16/34* (2013.01); *G11C 16/0483* (2013.01); *G11C 16/16* (2013.01); *G11C 16/26* (2013.01); *G11C 29/50004* (2013.01); *G11C 2029/5004* (2013.01)

(58) Field of Classification Search
CPC ..... G11C 16/0483; G11C 16/34; G11C 16/16; G11C 16/26

USPC ............. 365/189.09, 185.17, 185.24, 185.09
See application file for complete search history.

(56) References Cited

U.S. PATENT DOCUMENTS

| 2009/0003058 | A1* | 1/2009 | Kang | G11C 11/5642 365/185.03 |
| 2014/0365836 | A1* | 12/2014 | Jeon | G11C 16/26 714/721 |
| 2015/0117107 | A1* | 4/2015 | Sun | G11C 16/10 365/185.12 |
| 2015/0170751 | A1* | 6/2015 | Yanamanamanda | G11C 16/26 365/185.12 |
| 2016/0141046 | A1* | 5/2016 | Khandelwal | G11C 16/3427 365/185.02 |

(Continued)

*Primary Examiner* — Alfredo Bermudez Lozada
(74) *Attorney, Agent, or Firm* — Kunzler Bean & Adamson, PC

(57) ABSTRACT

Apparatuses, systems, methods, and computer program products for dynamically determining boundary word line voltage shift are presented. An apparatus includes an array of non-volatile memory cells and a controller. A controller includes a trigger detection component that is configured to detect a trigger condition associated with a last programmed word line of a partially programmed erase block of an array of non-volatile memory cells. A controller includes a voltage component that is configured to determine a read voltage threshold for a last programmed word line of a partially programmed erase block in response to a trigger condition. A controller includes a voltage shift component that is configured to calculate, dynamically, a read voltage threshold shift for a last programmed word line based on a determined read voltage threshold for the last programmed word line and a baseline read voltage threshold.

20 Claims, 10 Drawing Sheets

(56) References Cited

U.S. PATENT DOCUMENTS

2017/0084328 A1* 3/2017 Hsu .................... G11C 11/5628
2017/0117032 A1* 4/2017 Takizawa ............ G11C 11/4091

* cited by examiner

BOUNDARY WORD LINE VOLTAGE SHIFT

TECHNICAL FIELD

The present disclosure, in various embodiments, relates to computer storage devices and more particularly relates to dynamically determining a voltage shift of a boundary word line of a partially programmed erase block.

BACKGROUND

Memory devices may be organized into erase blocks or arrays of memory elements. Erase blocks may further be organized into pages, which are the smallest programmable unit physically made up of a row of cells linked on the same word line. Erase blocks may be partially programmed such that a programmed word line may be adjacent to an unprogrammed word line. The programmed word line may be known as a boundary word line. The boundary word line may have different characteristics than other programmed word lines, and therefore may have a different optimal read voltage threshold. A fixed read voltage threshold or a fixed read voltage threshold shift from a baseline read voltage threshold may be used for boundary word lines; however, the optimal read voltage threshold for the boundary word line may change over time due to different conditions or states of the boundary word line, making the fixed voltage threshold shifts ineffective.

SUMMARY

Various embodiments are disclosed, including apparatuses, systems, methods, and computer program products for dynamically determining boundary word line voltage shift. In one embodiment, an apparatus includes an array of non-volatile memory cells and a controller. A controller, in certain embodiments, includes a trigger detection component that is configured to detect a trigger condition associated with a last programmed word line of a partially programmed erase block of an array of non-volatile memory cells. A controller, in some embodiments, includes a voltage component that is configured to determine a read voltage threshold for a last programmed word line of a partially programmed erase block in response to a trigger condition. A controller, in a further embodiment, includes a voltage shift component that is configured to calculate, dynamically, a read voltage threshold shift for a last programmed word line based on a determined read voltage threshold for the last programmed word line and a baseline read voltage threshold.

A method, in one embodiment, includes detecting a trigger condition associated with a last programmed word line of a partially programmed erase block of an array of non-volatile memory cells. A method, in further embodiments, includes determining a read voltage threshold for a last programmed word line of a partially programmed erase block in response to a trigger condition. A method, in some embodiments, includes calculating, dynamically, a read voltage threshold shift for a last programmed word line based on a determined read voltage threshold for the last programmed word line and a baseline read voltage threshold. In certain embodiments, a method includes reading data from a last programmed word line using a determined read voltage threshold based on a read voltage threshold shift.

An apparatus, in one embodiment, includes means for detecting a trigger condition associated with a last programmed word line of a partially programmed erase block of an array of non-volatile memory cell. An apparatus, in further embodiments, includes means for determining a read voltage threshold for a last programmed word line of a partially programmed erase block in response to a trigger condition. An apparatus, in certain embodiments, includes mean for calculating, dynamically, a read voltage threshold shift for a last programmed word line based on a determined read voltage threshold for the last programmed word line and a baseline read voltage threshold. In one embodiment, an apparatus includes means for reading data from a last programmed word line based on a read voltage threshold shift for the last programmed word line.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1A:
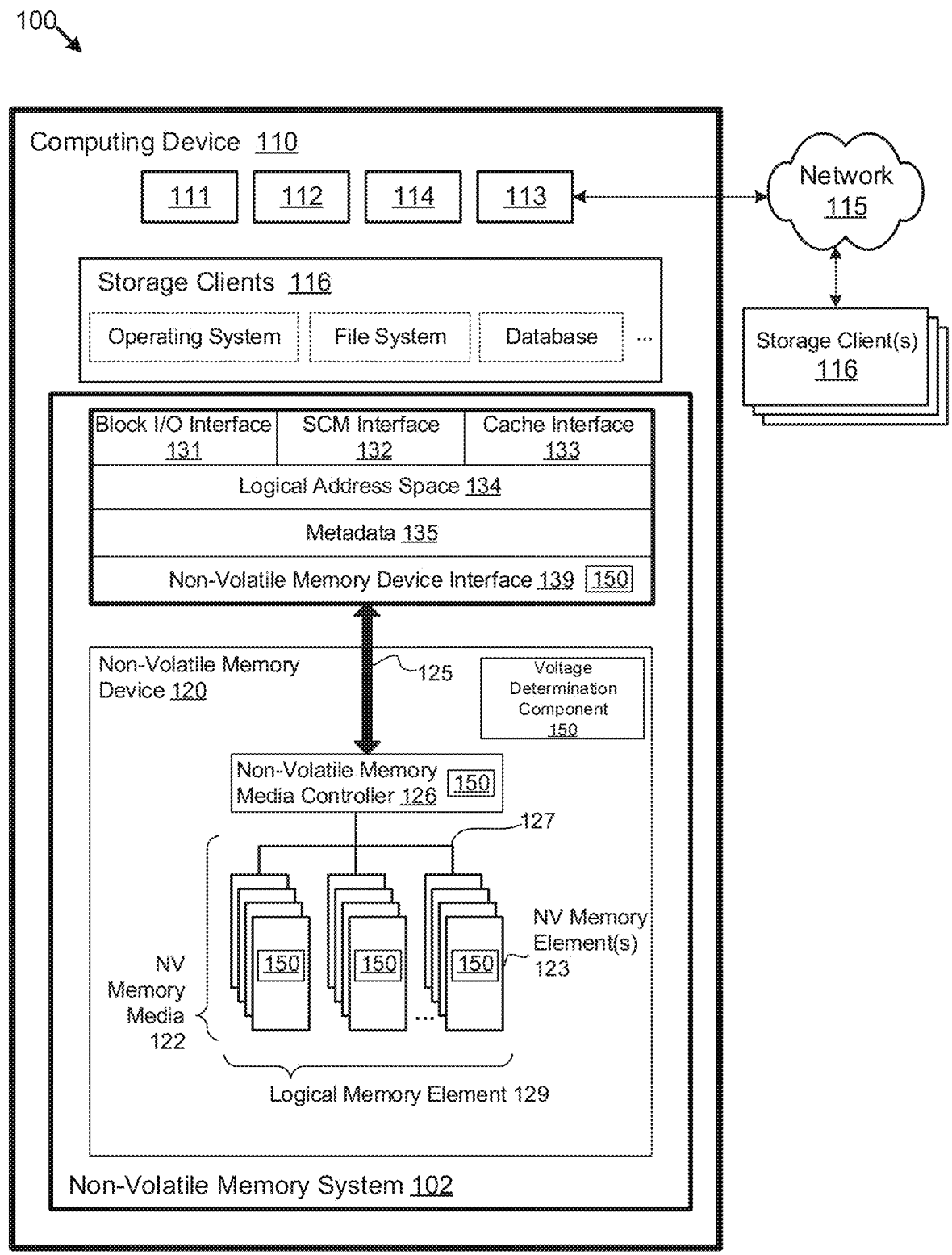
FIG. 1A is a schematic block diagram illustrating one embodiment of a system for dynamically determining boundary word line voltage shift.

Aspects of the present disclosure may be embodied as an apparatus, system, method, or computer program product. Accordingly, aspects of the present disclosure may take the form of an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodiment on one or more non-transitory computer-readable storage media storing computer-readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations that, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer-readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

In addition, as used herein, the term "set" can mean "one or more," unless expressly specified otherwise. The term "sets" can mean multiples of or a plurality of "one or mores," "ones or more," and/or "ones or mores" consistent with set theory, unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 including a voltage determination component 150 for a controller 126 of a non-volatile memory device 120. The voltage determination component 150 may be part of and/or in communication with a controller 126, a non-volatile memory element 123, a device driver, or the like. The voltage determination component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer-readable storage medium 114. The computer-readable storage medium 114 may comprise executable instructions configured to cause the computing device 110 (e.g., processor 111) to perform steps of one or more of the methods disclosed herein. Alternatively, or in addition, the voltage determination component 150 may be embodied as one or more computer-readable instructions stored on the non-transitory storage medium 114.

The non-volatile memory system 102, in the depicted embodiment, includes a voltage determination component 150. The voltage determination component 150, in one embodiment, is configured to determine a read voltage threshold and/or a read voltage threshold shift for a boundary word line. In certain embodiments, the voltage determination component 150 detects a trigger condition associated with a boundary word line of a partially programmed erase block of an array of non-volatile memory cells. In further embodiments, the voltage determination component 150 determines a read voltage threshold for the boundary word line and dynamically calculates a read voltage threshold shift for the boundary word line based on the determined read voltage threshold for the boundary word line and a baseline read voltage threshold.

In one embodiment, the voltage determination component 150 may comprise logic hardware of one or more non-volatile memory devices 120, such as a controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the voltage determination component 150 may comprise executable software code, such as a device driver or the like, stored on the computer-readable storage medium 114 for execution on the processor 111. In a further embodiment, the voltage determination component 150 may include a combination of both executable software code and logic hardware.

In one embodiment, the voltage determination component 150 is configured to receive I/O requests from a device driver or other executable application via a bus 125 or the like. The voltage determination component 150 may be further configured to transfer data to/from a device driver and/or storage clients 116 via the bus 125. Accordingly, the voltage determination component 150, in some embodiments, may comprise and/or be in communication with one or more direct memory access (DMA) modules, remote DMA modules, bus controllers, bridges, buffers, and so on to facilitate the transfer of memory/storage requests and storage operations of associated program data. In another embodiment, the voltage determination component 150 may receive storage requests as an API call from a storage client 116, as an IO-CTL command, or the like.

According to various embodiments, a controller 126 in communication with one or more voltage determination components 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more controllers 126.

A device driver may present a logical address space 134 to the storage clients 116 through one or more interfaces. As discussed above, the logical address space 134 may comprise a plurality of logical addresses, each corresponding to respective media locations of the one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more memory elements 123 of non-volatile memory media 122, which may include, but is not limited to: random access memory (RAM), resistive RAM (ReRAM), Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape, etc.), optical storage media, and/or the like, among other devices that are possible and contemplated herein. The one or more memory elements 123 of non-volatile memory media 122, in certain embodiments, comprise storage class memory (SCM).

While legacy technologies, such as NAND flash, may be block and/or page addressable, storage class memory, in one embodiment, is byte addressable. In further embodiments, SCM may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, and/or the like. Further, the non-volatile memory device 120, in various embodiments, may comprise a non-volatile recording device, a non-volatile memory device, a non-volatile storage device, and/or the like.

The non-volatile memory media 122 may comprise one or more non-volatile memory elements 123, which may include, but are not limited to: chips, packages, planes, die, and/or the like. A controller 126 may be configured to manage data operations on the non-volatile memory media 122, and may comprise one or more processors, programmable processors (e.g., FPGAs), ASICs, micro-controllers, or the like. In some embodiments, the controller 126 is configured to store data on and/or read data from the non-volatile memory media 122, to transfer data to/from the non-volatile memory device 120, and so on.

The controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, . . . WLN).

The controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library.

A device driver may be further configured to provide a cache interface 133 for caching data using the non-volatile memory system 102. A device driver may further comprise a non-volatile memory device interface 139 that is configured to transfer data, commands, and/or queries to the controller 126 over a bus 125, as described above.

Figure 1B:
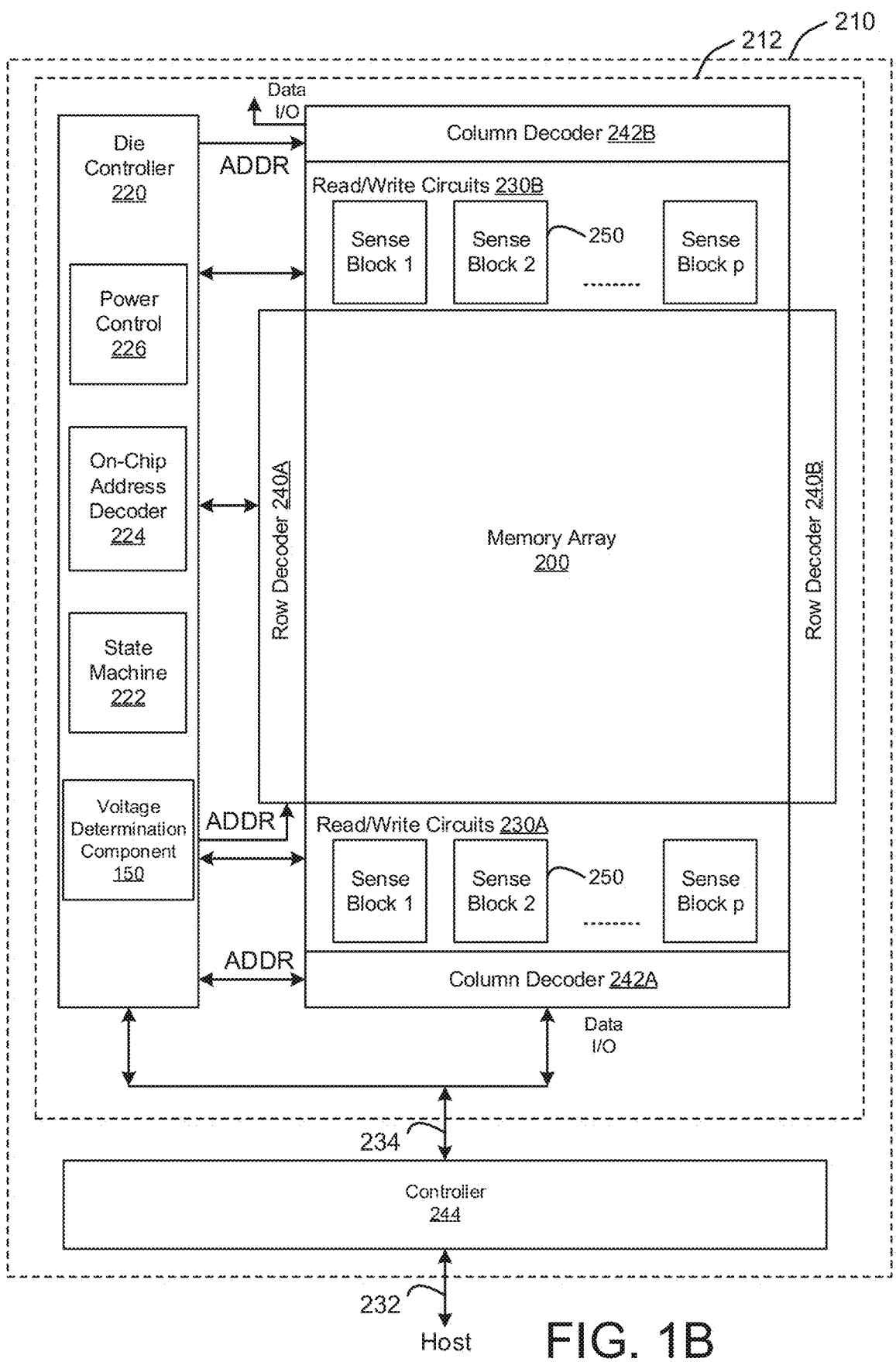
FIG. 1B is a schematic block diagram illustrating another embodiment of a system for dynamically determining boundary word line voltage shift.

FIG. 1B illustrates an embodiment of a non-volatile storage device 210 that may include one or more memory die and/or chips 212. Memory die 212, in some embodiments, includes an array (e.g., two-dimensional (2D), three dimensional (3D), etc.) of memory cells, die controller 220, and read/write circuits 230A/230B. In one embodiment, access to the memory array 200 by various peripheral circuits is implemented in a symmetric fashion, on opposite sides of the array, so that the densities of access lines and circuitry on each side are reduced by half. The read/write circuits 230A/230B, in a further embodiment, can include multiple sense blocks 250 that allow a page of memory cells to be read and/or programmed in parallel.

The memory array 200, in various embodiments, is addressable using word lines via row decoders 240A/240B and using bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes a voltage determination component 150, a state machine 222, and an on-chip address decoder 224. In one embodiment, the state machine 222 comprises at least a portion of the voltage determination component 150. In a further embodiment, the controller 244 comprises at least a portion of the voltage determination component 150. In various embodiments, one or more of the sense blocks 250 comprises at least a portion of the voltage determination component 150. The voltage determination component(s) 150 discussed with reference to FIG. 1B may be similar to the voltage determination component(s) 150 discussed with reference to FIG. 1A.

The state machine 222, in one embodiment, provides chip-level control of memory operations. The on-chip address decoder 224 provides an address interface to convert between the address that is used by the host or a memory controller to the hardware address used by the decoders 240A, 240B, 242A, and 242B. In certain embodiments, the state machine 222 includes an embodiment of the voltage determination component 150. The voltage determination component 150, in certain embodiments, is embodied as software in a device driver, hardware in a controller 244, and/or hardware in a die controller 220 and/or state machine 222. In one embodiment, one or any combination of die controller 220, voltage determination component 150, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 2:
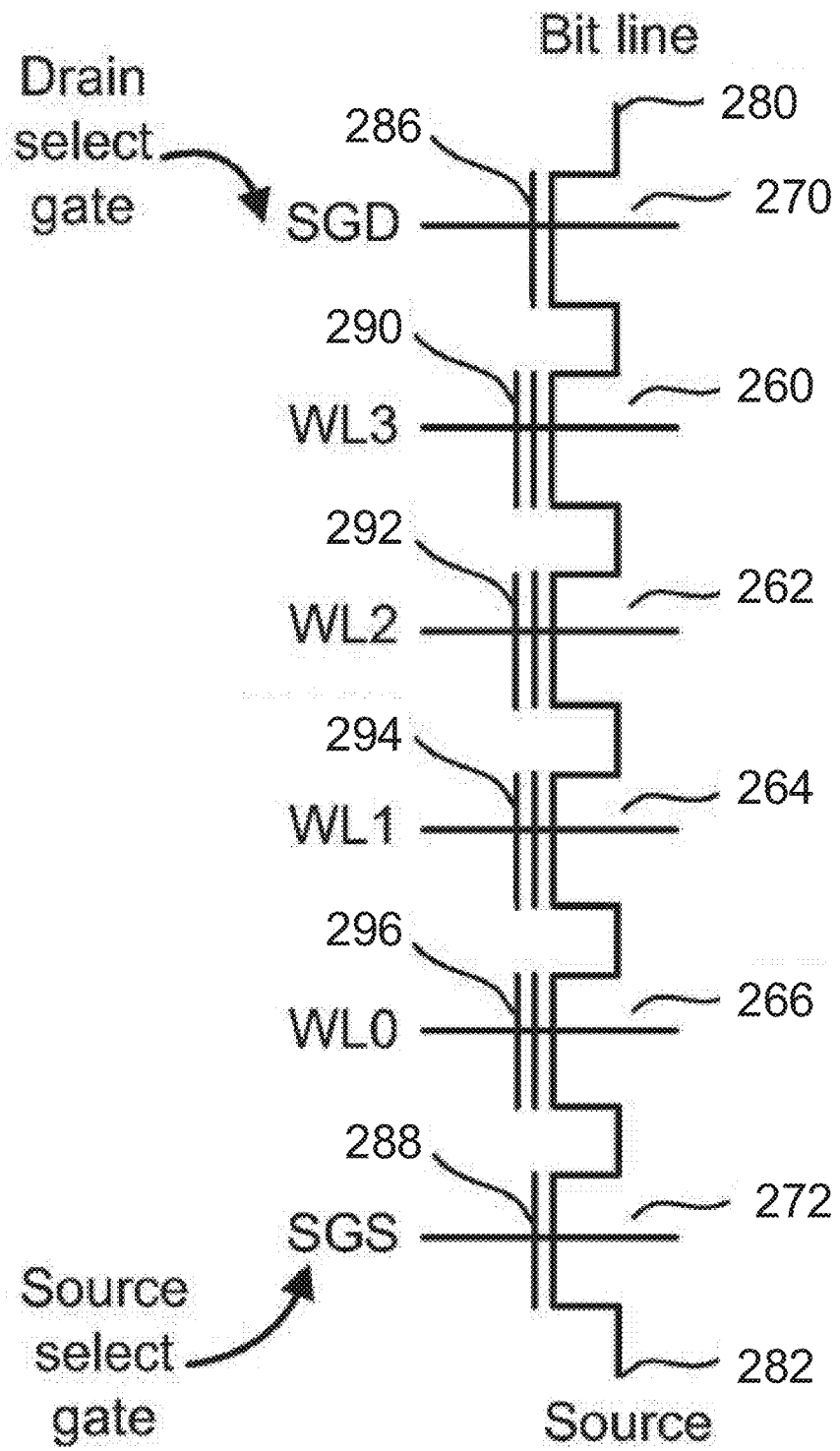
FIG. 2 is a schematic block diagram illustrating one embodiment of a string of storage cells.

FIG. 2 depicts one embodiment of a NAND string comprising a plurality of storage elements. The NAND string depicted in FIG. 2, in some embodiments, includes four transistors 260, 262, 264, and 266 connected in series and located between a first select transistor 270 and a second select transistor 272. In some embodiments, a transistor 260, 262, 264, 266 includes a control gate and a floating gate. A control gate 290, 292, 294, 296, in one embodiment, is connected to, or comprises a portion of, a word line. In a further embodiment, a transistor 260, 262, 264, 266 is a storage element, storage cell, or the like, also referred to as a memory cell 200. In some embodiments, a storage element may include multiple transistors 260, 262, 264, 266.

The first select transistor 270, in some embodiments, gates/connects the NAND string connection to a bit line 280 via a drain select gate SGD. The second select transistor 272, in certain embodiments, gates/connects the NAND string connection to a source line 282 via a source select gate SGS. The first select transistor 270, in a further embodiment, is controlled by applying a voltage to a corresponding select gate 286. The second select transistor 272, in some embodiments, is controlled by applying a voltage to corresponding select gate 288.

As shown in FIG. 2, the source line 282, in one embodiment, is connected to the sources of each transistor/storage cell 260, 262, 264, and 266 in the NAND string. The NAND string, in some embodiments, may include some storage elements 260, 262, 264, and 266 that have been programmed and some storage elements 260, 262, 264, and 266 that have not been programmed. As described in more detail below, the voltage determination component 150 controls whether portions of a storage device, such as a NAND string, are used for memory and/or storage operations.

Figure 3A:
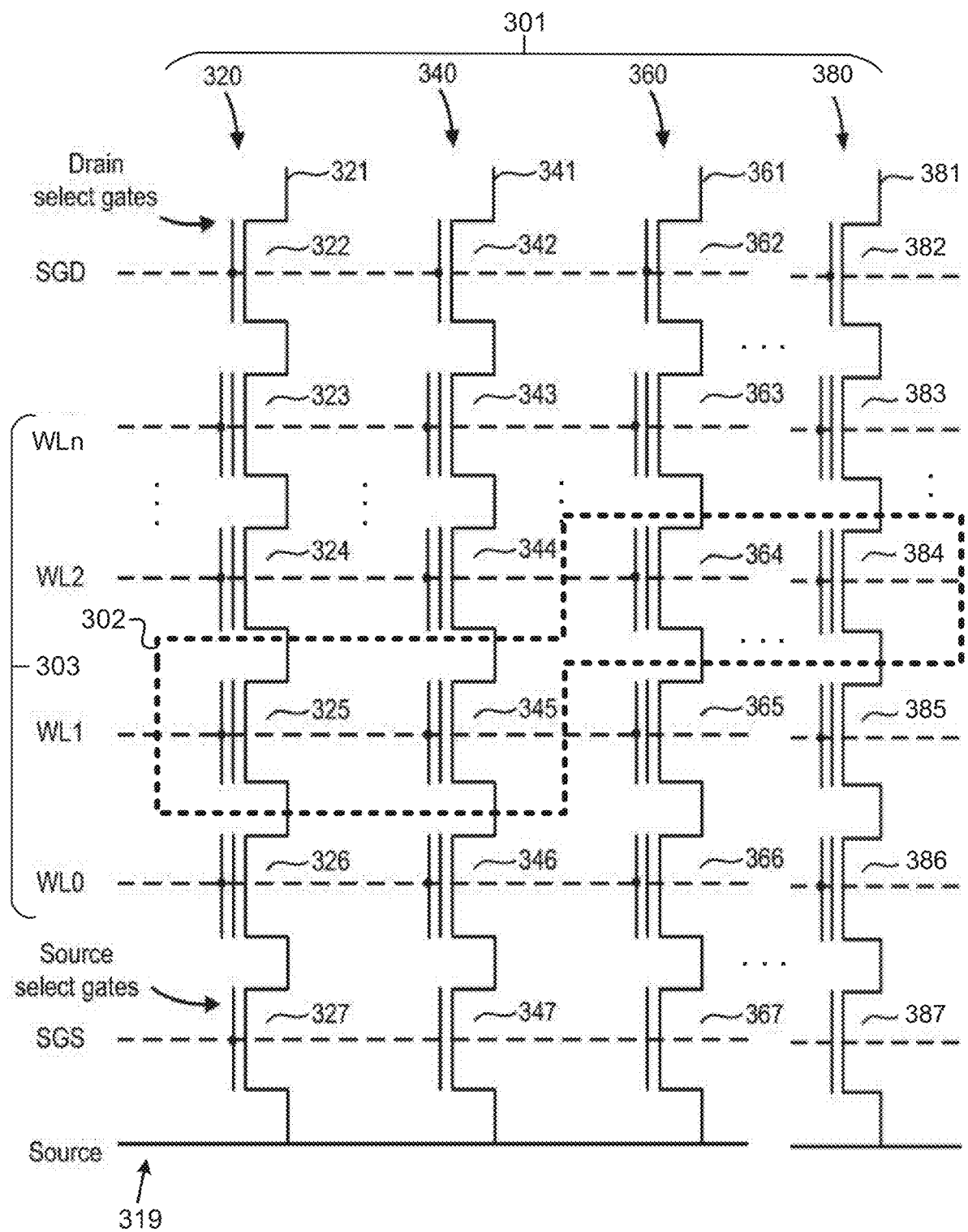
FIG. 3A is a schematic block diagram illustrating one embodiment of an array of storage cells.

FIG. 3A is a circuit diagram depicting a plurality of NAND strings 320, 340, 360, 380 (collectively 301). The architecture for a flash memory system using a NAND structure may include several NAND strings 301. For example, FIG. 3A illustrates NAND strings 301 in a memory array 200 that includes multiple NAND strings 301. In the depicted embodiment, each NAND string 320, 340, 360, 380 includes drain select transistors 322, 342, 362, 382, source select transistors 327, 347, 367, 387, and storage elements 323-326, 343-346, 363-366, 383-386. While four storage elements 323-326, 343-346, 363-366, 383-386 per NAND string 301 are illustrated for simplicity, some NAND strings 301 can include any number of storage elements (e.g., thirty-two, sixty-four, or the like storage elements, among other storage elements that are possible and contemplated herein).

NAND strings 301, in one embodiment, are connected to a source line 319 by source select transistors 327, 347, 367, 387. A selection line SGS may be used to control the source side select transistors. The various NAND strings 301, in one embodiment, are connected to bit lines 321, 341, 361, 381 by drain select transistors 322, 342, 362, 382. The drain select transistors 322, 342, 362, 382 may be controlled by a drain select line SGD. In some embodiments, the select lines do not necessarily need to be in common among the NAND strings 301; that is, different select lines can be provided for different NAND strings 301.

As described above, each word line WL0-WLn (collectively 303) comprises one or more storage elements 323-383, 324-384, 325-385, 326-386. In the depicted embodiment, each bit line 321, 341, 361, 381 and the respective NAND string 320, 340, 360, 380 comprise the columns of the memory array 200, storage block, erase block, or the like. The word lines 303, in some embodiments, comprise the rows of the memory array 200, storage block, erase block, or the like. Each word line 303, in some embodiments, connects the control gates of each storage element 323-383, 324-384, 325-385, 326-386 in a row. Alternatively, the control gates may be provided by the word lines 303 themselves. In some embodiments, a word line 303 may include tens, hundreds, thousands, millions, or the like of storage elements 323-383, 324-384, 325-385, 326-386.

In one embodiment, the last programmed word line 303 of a NAND string 301 of a partially programmed erase block is known as a boundary word line. For example, the array of storage cells 323-326, 343-346, 363-366 illustrated in FIG. 3A may be an erase block, and the erase block may not be fully programmed, meaning not every storage cell 323-326, 343-346, 363-366 in the erase block currently stores data, e.g., some storage cells 326, 346, 365-366, 385-386 along WL1 and WL0 are not programmed. In such an embodiment, the programmed storage cells 325, 345, 364, 384 that are adjacent to the unprogrammed storage cells 326, 346, 365, 385 are the storage cells comprising the last programmed word line, otherwise known herein as boundary word line storage cells 302, which may apply to both two-dimensional and three-dimensional NAND strings. The boundary word line storage cells 302 may have different storage/voltage characteristics than the other programmed storage cells in the erase block due to various factors such as program disturb, read disturb, temperature, retention times, read counts, and/or the like. Furthermore, the storage/voltage characteristics for boundary word line storage cells 302 may vary across different storage dies 212, erase blocks, word lines, and/or the like.

In conventional storage systems, a fixed read voltage shift may be used to compensate for voltage drifts of the boundary word line storage cells 302 and the other programmed storage cells caused by the above mentioned factors; however, using the same fixed read voltage shift for the boundary word line storage cells 302 as the other programmed storage cells may not be optimal for the boundary word line storage cells 302 because of their different storage/voltage characteristics due to their location in the erase block, e.g., their location adjacent to an unprogrammed storage cell. For instance, because the boundary word line storage cells 302 are adjacent to a single programmed storage cell, their read voltage threshold may not have drifted as much due to read and/or program disturbs as compared to other programmed storage cells that are adjacent to two programmed storage cells. Furthermore, the boundary word line storage cells 302 may react differently to data retention conditions, temperature conditions, and/or the like due to their locations on the erase block. Accordingly, static or fixed read voltage shifts may not be the best approach to compensate for read voltage threshold drifts of boundary word line storage cells 302.

In one embodiment, each storage element 323-326, 343-346, 363-366, 383-386 is configured to store data. For example, when storing one bit of digital data, the range of possible threshold voltages ("VTH") of each storage element 323-326, 343-346, 363-366, 383-386 may be divided into two ranges that are assigned logical data "1" and "0." In one example of a NAND type flash memory, the VTH may be negative after the storage elements 323-326, 343-

346, 363-366, 383-386 are erased, and defined as logic "1." In one embodiment, the VTH after a program operation is positive and defined as logic "0."

When the VTH is negative and a read is attempted, in some embodiments, storage elements 323-326, 343-346, 363-366, 383-386 will turn on to indicate logic "1" is being stored. When the VTH is positive and a read operation is attempted, in a further embodiment, a storage element will not turn on, which indicates that logic "0" is stored. Each storage element 323-383, 324-384, 325-385, 326-386 may also store multiple levels of information, for example, multiple bits of digital data. In such an embodiment, the range of VTH value is divided into the number of levels of data. For example, if four levels of information can be stored in each storage element 323-326, 343-346, 363-366, 383-386, there will be four VTH ranges assigned to the data values "11", "10", "01", and "00."

In one example of a NAND type memory, the VTH after an erase operation may be negative and defined as "11." Positive VTH values may be used for the states of "10", "01", and "00." In one embodiment, the specific relationship between the data programmed into the storage elements 323-326, 343-346, 363-366, 383-386 and the threshold voltage ranges of the storage elements 323-326, 343-346, 363-366, 383-386 depends upon the data encoding scheme adopted for the storage elements 323-326, 343-346, 363-366, 383-386.

In some embodiments, portions of the storage elements 323-326, 343-346, 363-366, 383-386 may be defective. In such an embodiment, the voltage determination component 150 may manage which portions of the storage elements 323-326, 343-346, 363-366, and 383-386 are used for operations.

Figure 3B:
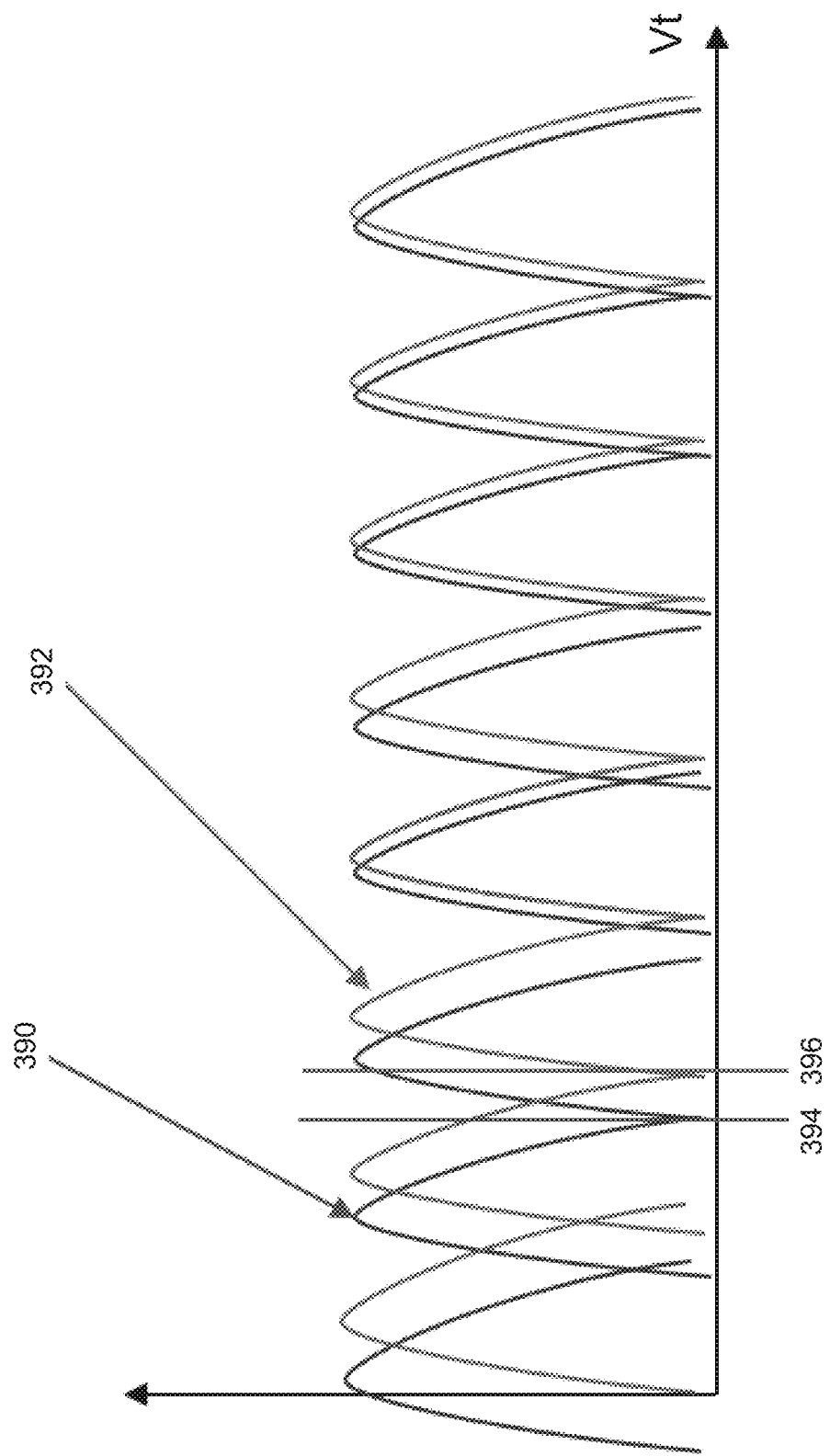
FIG. 3B is a diagram of the voltage shift across an array of storage cells.

FIG. 3B illustrates the read voltage threshold distribution and shift differences across an array of storage cells between boundary word line storage cells 302 and non-boundary word line storage cells (e.g., programmed storage cells that are not the last programmed storage cells of a word line). For instance, as illustrated in FIG. 3B, the read voltage threshold shift distributions 390 of the boundary word line storage cells 302 are shifted even further than the read voltage threshold shift distributions 392 of non-boundary word line storage cells. Furthermore, in certain embodiments, lower voltage states 394, e.g., voltage states towards the left of the graph depicted in FIG. 3B, for boundary word line storage cells 302 tend to have larger read voltage threshold shifts than lower voltage states 396 for non-boundary word line storage cells. Due to the differences in read voltage threshold shifts between boundary word line storage cells 302 and non-boundary word line storage cells, a static or fixed read voltage shift table may not be sufficient to correct or compensate for the read voltage threshold shifts of the boundary word line storage cells 302. However, as described in more detail below, the voltage determination component 150 dynamically determines the read voltage threshold shift of the boundary word line storage cells 302 to compensate for the read voltage shift differences.

Figure 4:
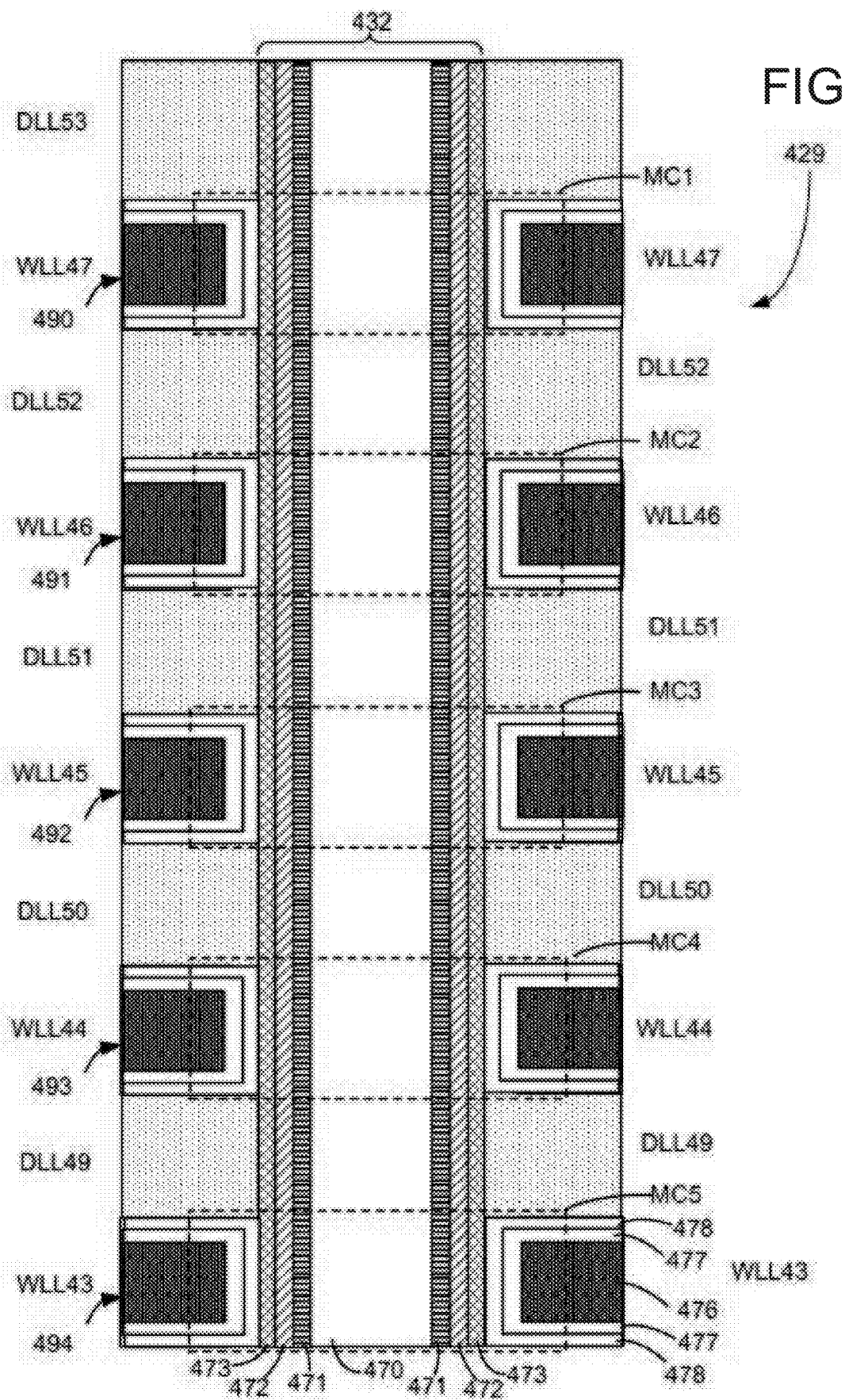
FIG. 4 is a schematic block diagram illustrating one embodiment of a three-dimensional (3D), vertical NAND flash memory structure.

FIG. 4 illustrates one embodiment of a cross-sectional view of a 3D, vertical NAND flash memory structure 429 or string 429. In one embodiment, the vertical column 432 is round and includes four layers; however, in other embodiments more or less than four layers can be included and other shapes can be used (e.g., a "U" shape instead of an "I" shape or the like). In one embodiment, a vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is a shared charge-trapping layer 473, such as (for example) Silicon Nitride. Other materials and/or structures can also be used. That is, the technology discussed herein is not limited to any particular material and/or structure.

As shown, FIG. 4 depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO2) layer 478. The physical interaction of the word line layers with the vertical column forms the memory cells. Thus, a memory cell, in one embodiment, comprises channel 471, tunneling dielectric 472, charge-trapping layer 473 (e.g., shared with other memory cells), blocking oxide layer 478, aluminum oxide layer 477 and word line region 476. In some embodiments, the blocking oxide layer 478 and aluminum oxide layer 477, may be replaced by a single layer of material with insulating properties or by more than 2 layers of different material with insulating properties. Furthermore, the materials used are not limited to silicon dioxide (SiO2) or aluminum oxide. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge-trapping layer 473 that is associated with the memory cell. These electrons are drawn into the charge-trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge-trapping layer. During an erase operation, the electrons return to the channel or holes are injected into the charge-trapping layer to recombine with electrons. In one embodiment, erasing is achieved using hole injection into the charge-trapping layer via a physical mechanism such as gate induced drain leakage (GIDL).

Storage cells in the same location or position in different memory structures 429 (e.g., different NAND strings 429) on different bit lines, in certain embodiments, may be on the same word line. Each word line may store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D NAND flash memory structure 429 comprises an "I" shaped memory structure 429. In other embodiments, a vertical, 3D NAND flash memory structure 429 may comprise a "U" shaped structure, or may have another vertical and/or stacked architecture. In certain embodiments, four sets of strings 429 (e.g., four sets of 48 word lines, or another predefined number of word lines) may form an erase block, while in other embodiments, fewer or more than four sets of strings 429 may form an erase block. As may be appreciated, any suitable number of storage cells may be part of a single string 429. In one embodiment, a single string 429 includes 48 storage cells.

Figure 5:
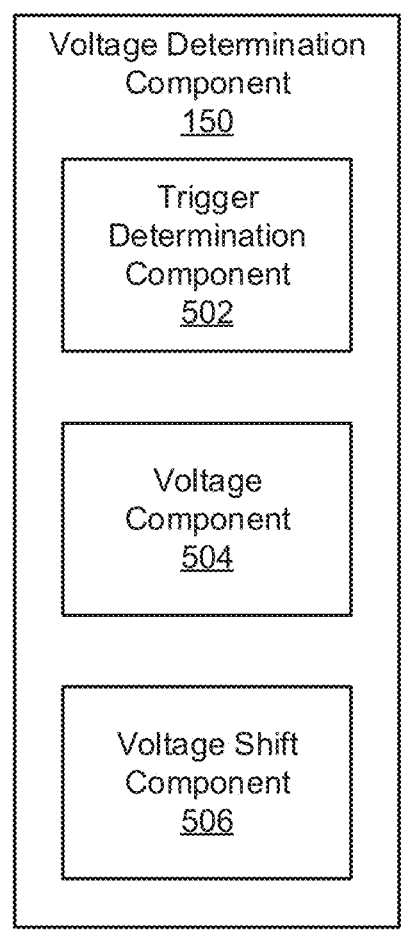
FIG. 5 is a schematic block diagram illustrating one embodiment of a voltage determination component for dynamically determining boundary word line voltage shift.

FIG. 5 is a schematic block diagram illustrating one embodiment of a voltage determination component 150 for dynamically determining boundary word line voltage shift. The voltage determination component 150, in one embodiment, includes one or more of a trigger detection component 502, a voltage component 504, and a voltage shift component 506, which are described in more detail below.

In one embodiment, the trigger detection component 502 is configured to detect a trigger condition associated with a boundary word line storage cell 302 of a partially programmed erase block of an array 200 of non-volatile memory cells. As used herein, a boundary word line storage cell 302 is a last programmed word line 303 of a NAND string 301, as described above with reference to FIG. 3A. The boundary word line storage cell 302, for example, may be the last programmed word line 303 of a NAND string 301 of a partially programmed erase block such that the storage cells of a boundary word line 302 are adjacent to a programmed memory cell and an unprogrammed memory cell of the respective NAND strings 301.

The trigger detection component 502 is configured to detect, monitor, check for, sense, and/or the like one or more trigger conditions associated with a boundary word line storage cell 302. As explained below, the detection of the trigger condition may initiate, cause, trigger, start, and/or the like recalibration of a read voltage threshold shift of a boundary word line storage cell 302, which, as explained above, may have different voltage threshold characteristics, e.g., voltage shift from a baseline voltage, than other programmed storage cells of an erase block.

In one embodiment, the trigger condition includes detecting that a predetermined amount of time has passed since the read voltage threshold shift for the boundary word line storage cell 302 was previously determined, since the last read operation performed on the boundary word line storage cell 302, since a program operation performed on the boundary word line storage cell 302, and/or the like. For example, after a boundary word line storage cell 302 is programmed, the voltage determination component 150, a controller 126, and/or the like may start a timer that is set for a predefined period of time, such as two hours. When the timer expires, the voltage determination component 150 and/or the controller 126 may send a notification, a signal, and/or another indication to the trigger detection component 502 to indicate that the timer has expired.

In one embodiment, the trigger condition includes determining that an error rate for a boundary word line storage cell 302 satisfies a predetermined error rate threshold for the boundary word line storage cell 302. For instance, the trigger detection component 502 may detect a high (e.g., above a threshold), abnormal, and/or the like rate of errors, e.g., read errors detected during read operations performed on boundary word line storage cells 302, which may indicate that the voltage setting for reading data from the boundary word line storage cell 302 is not optimal, and thus the read voltage threshold and/or the read voltage threshold shift for the boundary word line storage cell 302 should be calibrated/recalibrated.

In further embodiments, the trigger condition includes determining that a temperature associated with a boundary word line storage cell 302 satisfies a temperature threshold for the boundary word line storage cell 302. In certain embodiments, the temperature of the non-volatile storage device that includes the boundary word line storage cells 302 may vary and change on an ongoing basis from less than a degree to as much as a few degrees or more. Accordingly, the temperature changes may affect the read voltage thresholds for the boundary word line storage cells 302 differently than other programmed storage cells in the erase block.

In such an embodiment, the voltage determination component 150, a controller 126, and/or the like may track, monitor, check, or the like the temperature of the boundary word line storage cells 302, the temperature of the erase block, the temperature of the die 212, die plane, storage device, and/or the like. If the temperature satisfies the temperature threshold, e.g., the temperature is greater than, less than, and/or equal to the temperature threshold, the voltage determination component 150, a controller 126, and/or the like may notify or signal the trigger detection component 502 that the temperature threshold has been satisfied.

In one embodiment, the trigger condition includes determining that a number of read operations that are performed on a boundary word line storage cell 302 satisfies, e.g., is greater than or equal to, a predetermined read operation threshold for the boundary word line storage cell 302. For example, the voltage determination component 150, a controller 126, and/or the like may track how many read operations are performed on boundary word line storage cells 302, and may notify or signal the trigger detection component 502 when the number of detected read operations is greater than or equal to a threshold number of read operations.

The trigger detection component 502 may detect or monitor for other trigger conditions or factors including a number of program/erase ("P/E") cycles for the erase block, the location in the memory array of boundary word line storage cells 302, the number of uncorrectable errors detected on a boundary word line storage cell 302, the data retention times for boundary word line storage cells 302, and/or the like. For example, if the P/E cycle count for the erase block is greater than or equal to a predetermined P/E cycle count threshold, then the trigger detection component 502 may signal that recalibration of the voltage shifts of the boundary word line storage cells 302 should be performed. Similarly, if a boundary word line storage cell 302 has stored data for an amount of time that exceeds a predetermined retention threshold time, then the trigger detection component 502 may signal that recalibration of the voltage shifts of the boundary word line storage cells 302 should be performed.

In certain embodiments, after the trigger detection component 502 detects the trigger condition, the trigger detection component 502 notifies, signals, and/or the like the voltage component 504 and/or the voltage shift component 506 to initiate calibration/recalibration of the read voltage threshold shift for the boundary word lines 302.

In one embodiment, the voltage component 504 is configured to dynamically determine a read voltage threshold for a boundary word line storage cell 302 of a partially programmed erase block in response to the trigger condition that the trigger detection component 502 detects. To determine the read voltage threshold for a boundary word line storage cell 302, in one embodiment, the voltage component 504 reads data from the boundary word line storage cell 302 using a predefined, predetermined, default, set, stored, configured, and/or the like read voltage threshold. In certain embodiments, the read voltage threshold that the voltage component 504 uses to read data from the boundary word line storage cell 302 is different than a default read voltage threshold for the boundary word line storage cell 302.

For instance, in one embodiment, the voltage component 504 reads data from a boundary word line storage cell 302 using a default read voltage threshold, e.g., a read voltage threshold that is set by the manufacturer, storage controller 126, and/or the like. In another embodiment, the voltage component 504 reads data from a boundary word line storage cell 302 using a read voltage threshold that is determined dynamically while the non-volatile memory device 120 is in use. For example, the voltage component 504 may reference a table of read voltage shifts for the boundary word line storage cell 302 and use the default or other reference read voltage threshold adjusted by the read voltage shift for the particular boundary word line storage cell 302 to read data from the boundary word line storage cell 302. In some embodiments, as discussed above, the read voltage shift may be a static, predefined, predetermined value that does not change dynamically over time as the non-volatile memory device 120 is in use. Accordingly, using the fixed read voltage shift may not be the optimal read voltage threshold for the boundary word line storage cell 302.

In one embodiment, to determine the optimal read voltage threshold for a boundary word line storage cell 302, the voltage component 504 reads data from the boundary word line storage cell 302 using a read voltage threshold for the boundary word line storage cell 302 and uses an error correction code ("ECC") word to locate, determine, find, and/or the like the boundary between states or abodes for the boundary word line storage cell 302. For example, a single-level memory cell may have two states, a high and a low state, that can be read using a read voltage threshold range that corresponds to the states. Over time the read voltage threshold range may shift up or down based on various factors, as discussed above, such as read disturbs, program disturbs, temperature, and/or the like. Boundary word line storage cells 302, however, may have different read voltage threshold characteristics due to their location in the erase block, e.g., adjacent to a programmed storage cell and an unprogrammed storage cell, than other programmed storage cells in an erase block. Thus, the optimal read voltage threshold for a boundary word line storage cell 302 may be different than other programmed storage cells. Accordingly, predefined or static voltage shifts or adjustments may not apply to boundary word line storage cells 302 like it does to other programmed storage cells in the erase block. Therefore, in one embodiment, the voltage component 504 uses a read voltage threshold and an ECC code word to determine the optimal read voltage thresholds for a boundary word line storage cell 302.

The voltage shift component 506, in one embodiment, is configured to dynamically calculate a read voltage threshold shift for a boundary word line storage cell 302 based on the read voltage threshold that the voltage component 504 determined for the boundary word line storage cell 302 and a baseline read voltage threshold. The baseline read voltage threshold, for example, may include a default read voltage threshold, a predefined read voltage threshold, a calculated, estimated, or otherwise dynamically determined read voltage threshold, and/or the like for the NAND string 301, the erase block, the die 212, the die plane, the non-volatile storage device 120, and/or the like. Determination of the baseline read voltage threshold is described in more detail below with reference to the baseline voltage component 604.

In one embodiment, the voltage shift component 506 determines or calculates the read voltage threshold shift for a boundary word line storage cell 302 as a function of the baseline read voltage threshold, e.g., by taking the difference between the read voltage threshold for the boundary word line 302 and the baseline read voltage, by calculating an average read voltage threshold using the read voltage threshold for the boundary word line 302 and the baseline read voltage and determining the difference between the average read voltage threshold and the read voltage threshold for the boundary word line 302, and/or the like. In certain embodiments, the read voltage threshold shift determined as a function of the baseline read voltage threshold that the voltage shift component 506 determines is stored for future reference in a table, a data store, a list, a log, and/or the like, as explained in more detail below.

Figure 6:
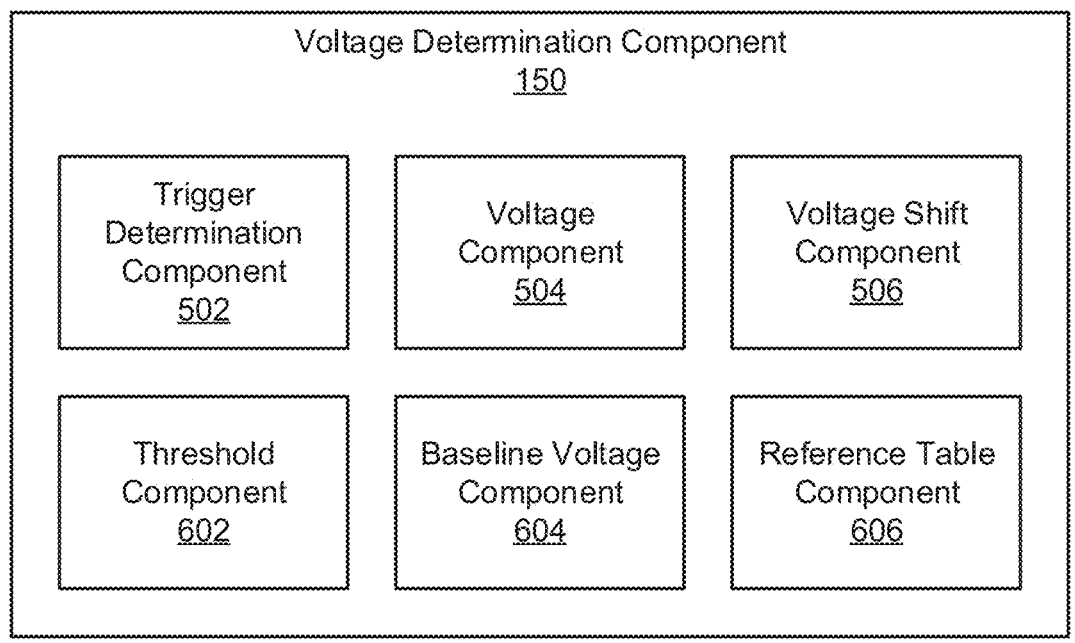
FIG. 6 is a schematic block diagram illustrating one embodiment of another voltage determination component for dynamically determining boundary word line voltage shift.

FIG. 6 is a schematic block diagram illustrating one embodiment of a voltage determination component 150 for dynamically determining boundary word line voltage shift. The voltage determination component 150, in one embodiment, includes one or more of a trigger detection component 502, a voltage component 504, and a voltage shift component 506, which may be substantially similar to the trigger detection component 502, the voltage component 504, and the voltage shift component 506 described above with reference to FIG. 6. In further embodiments, the voltage determination component 150 includes one or more of a threshold component 602, a baseline voltage component 604, and a reference table component 606, which are described in more detail below.

The threshold component 602, in one embodiment, is configured to determine thresholds for detecting the trigger condition for a boundary word line storage cell 302. In certain embodiments, the thresholds may include thresholds for an amount of time since the read voltage threshold for the boundary word line storage cell 302 was last calculated, temperature thresholds, data retention time thresholds, P/E cycle count thresholds, error/error rate thresholds, read operation count thresholds, program operation count thresholds, and/or the like. In various embodiments, the threshold component 602 determines the thresholds according to the location of the boundary word line storage cell 302, e.g., the position in the NAND string 301, the position in the erase block, the position in the die 212, and/or the like.

For example, the threshold component 602 may determine that the location of a boundary word line storage cell 302 in a 3D NAND string is more reactive, sensitive, responsive, and/or the like to temperature and therefore may set a low temperature threshold for the trigger determination component 502 to monitor so that small temperature changes may trigger the recalibration of the read voltage threshold shift for the boundary word line storage cell 302. Similarly, if the location of a boundary word line storage cell 302 in a 3D NAND string is less reactive, sensitive, responsive, and/or the like to temperature, the threshold component 602 may set a high temperature threshold for the trigger determination component 502 to monitor so that larger temperature changes may trigger the recalibration of the read voltage threshold shift for the boundary word line storage cell 302.

In one embodiment, the baseline voltage component 604 is configured to determine a baseline read voltage threshold for a boundary word line storage cell 302, a NAND string, an erase block, a die 212, a non-volatile storage device 120, and/or the like. In one embodiment, the baseline voltage component 604 references a predetermined, predefined, preset, and/or the like read voltage threshold for one or more reference storage cells for the erase block, e.g., storage cells that have been designated as storage cells that have an optimal read voltage threshold and/or other storage cells that are programmed and are not boundary word line storage cells 302 for the NAND string 301, the erase block, the die 212, the die plane, the non-volatile storage device 120, and/or the like. Furthermore, the voltage shift component 506 may further incorporate any predetermined voltage shifts, e.g., by referencing a voltage shift threshold for the sample storage cells. For example, for the particular sampled storage cells, the determined voltage may be shifted In one embodiment, the voltage shift component 506 dynamically determines or calculates the baseline read voltage threshold by sampling read voltage thresholds for one or more programmed storage cells of the partially programmed erase block where the boundary word line storage cells 302 are located, of a corresponding fully-programmed erase block, of other erase blocks that are partially or fully programmed, of other dies 212, of other non-volatile storage devices 120, and/or the like. For example, the voltage shift component 506 may calculate or determine the baseline voltage dynamically in response to the trigger detection component 502 detecting the trigger condition by sampling read voltage thresholds for one or more programmed storage cells of the partially programmed erase block. The voltage shift component 506 may use a median, mode, mean, and/or the like of the sampled read voltage thresholds as the baseline read voltage threshold.

In one embodiment, the reference table component 606 is configured to generate one or more reference tables of calculated voltage shifts for boundary word line storage cells 302. The reference tables, for instance, may be referenced to determine the read voltage shift for boundary word line storage cells 302 when read operations are performed on boundary word line storage cells 302. The reference table, in one embodiment, includes a database table, a list, a log, a map (e.g., a mapping of boundary word line storage cells 302 to read voltage shifts corresponding to the boundary word line storage cells 302), and/or the like. In certain embodiments, the reference table component 606 stores the reference tables in volatile memory such as SRAM, DRAM, and/or the like of a controller 126. In some embodiments, the reference table component 606 stores the reference tables in non-volatile memory, such as on the non-volatile storage device 120, so that the reference tables persist across power cycles of the host computing device 110.

In one embodiment, the reference table component 606 creates separate reference tables for each boundary word line storage cell 302. In such an embodiment, each reference table may comprise a single read voltage threshold shift for a corresponding boundary word line storage cell 302. This may otherwise be known as creating a reference table on a per NAND string 301 basis because each NAND string 301 may have only one boundary word line storage cell 302.

In further embodiments, the reference table component 606 creates reference tables for multiple NAND strings 301 or groups of NAND Strings 301 such that the read voltage threshold shift stored in the reference table corresponds to multiple boundary word line storage cells 302. Similarly, the reference table component 606 creates reference tables for each NAND string 301 in an erase block such that the read voltage threshold shift stored in the reference table corresponds to each boundary word line storage cell 302 of each NAND string 301 in the erase block. In certain embodiments, the reference table component 606 creates a reference table for multiple erase blocks, multiple dies 212, and/or the like such that the read voltage threshold shift corresponds to each boundary word line storage cell 302 of each of the multiple erase blocks. In such an embodiment, the erase blocks, dies 212, and/or the like may have similar storage characteristics for boundary word line storage cells 302 such as substantially similar read counts, P/E counts, temperatures, data retention times, and/or the like.

In one embodiment, the reference table component 606 also include the determined read voltage threshold for a boundary word line storage cell 302 in the reference table so that the determined read voltage threshold can be used for read operations instead of, or in addition to, the determined read voltage threshold shift.

Figure 7:
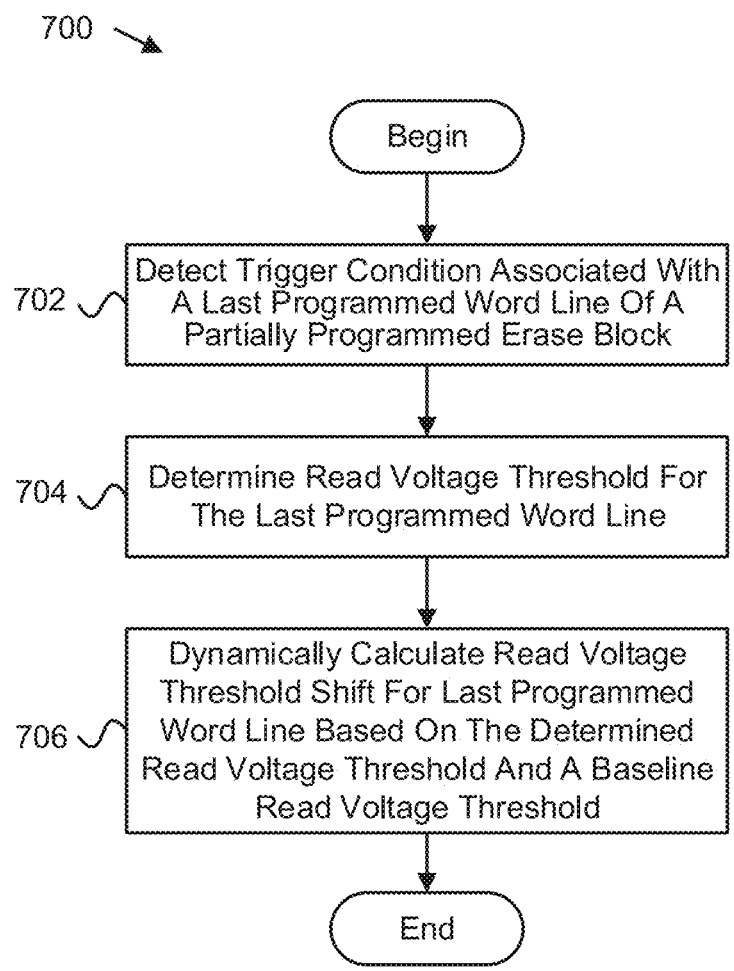
FIG. 7 is a schematic flow chart diagram illustrating one embodiment of a method for dynamically determining boundary word line voltage shift.

FIG. 7 is a schematic flow chart diagram illustrating one embodiment of a method for dynamically determining boundary word line voltage shift. In one embodiment, the method 700 begins and the trigger determination component 502 detects 702 a trigger condition associated with a boundary word line storage cell 302 (a.k.a., a last programmed word line) of a partially programmed erase block. In further embodiments, the voltage component 504 determines 704 a read voltage threshold for the boundary word line storage cell 302 of the partially programmed erase block in response to the trigger condition. In certain embodiments, the voltage shift component 506 dynamically calculates 706 a read voltage threshold shift for the boundary word line storage cell 302 based on the determined read voltage threshold for the boundary word line storage cell 302 and a baseline read voltage threshold, and the method 700 ends.

Figure 8:
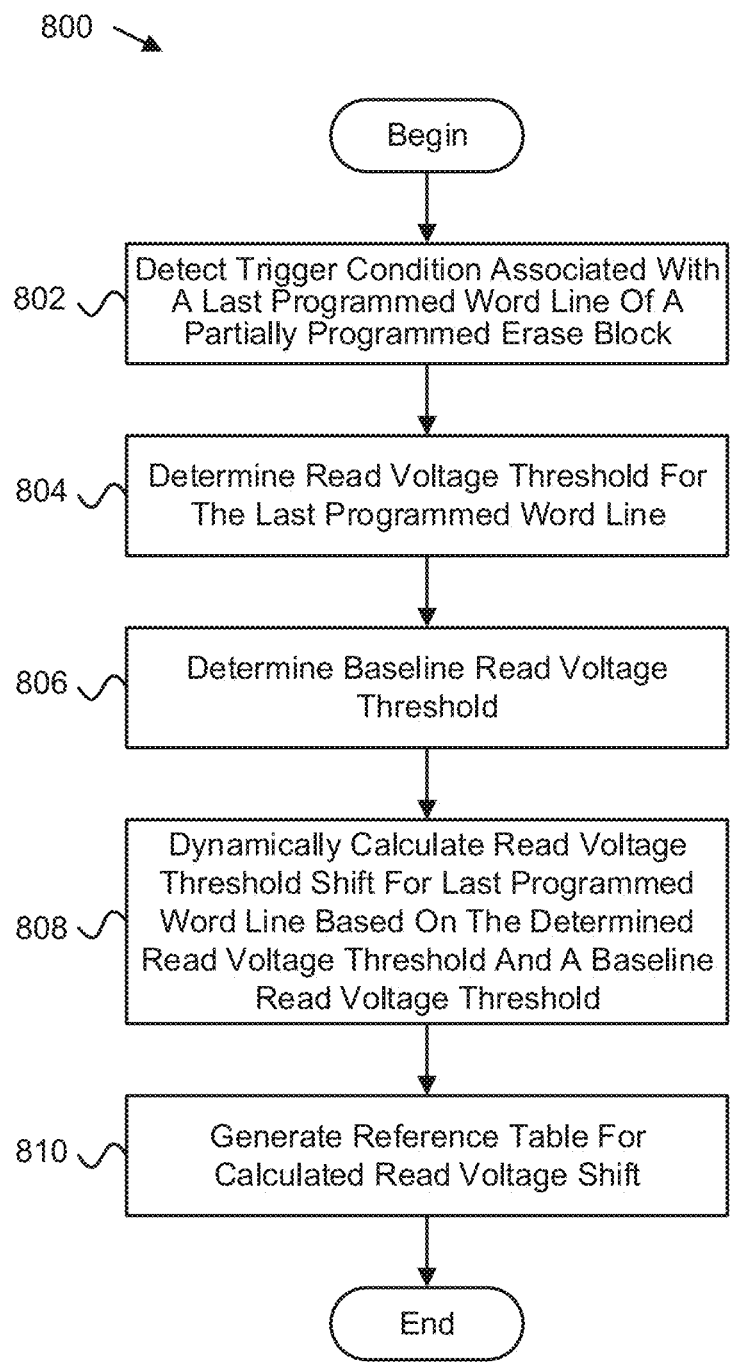
FIG. 8 is a schematic flow chart diagram illustrating one embodiment of another method for dynamically determining boundary word line voltage shift.

FIG. 8 is a schematic flow chart diagram illustrating one embodiment of a method for dynamically determining boundary word line voltage shift. In one embodiment, the method 800 begins and the trigger determination component 502 detects 802 a trigger condition associated with a boundary word line storage cell 302 (a.k.a., a last programmed word line) of a partially programmed erase block. In further embodiments, the voltage component 504 determines 804 a read voltage threshold for the boundary word line storage cell 302 of the partially programmed erase block in response to the trigger condition.

In one embodiment, the baseline voltage component 604 determines 806 a baseline read voltage threshold. In some embodiments, the voltage shift component 506 dynamically calculates 808 a read voltage threshold shift for the boundary word line storage cell 302 based on the determined read voltage threshold for the boundary word line storage cell 302 and a baseline read voltage threshold. In various embodiments, the reference table component 606 generates 810 a reference table for the calculated read voltage threshold shift, and the method 800 ends.

Means for detecting a trigger condition associated with a last programmed word line (a boundary word line storage cell 302) includes, in various embodiments, may include one or more of a voltage determination component 150, a trigger determination component 502, a controller 126, a die controller 220, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for detecting a trigger condition associated with a last programmed word line (a boundary word line storage cell 302).

Means for determining a read voltage threshold for a last programmed word line (a boundary word line storage cell 302) of a partially programmed erase block in response to a trigger condition include, in various embodiments, may include one or more of a voltage determination component 150, a voltage component 504, a controller 126, a die controller 220, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for determining a read voltage threshold for a last programmed word line (a boundary word line storage cell 302) of a partially programmed erase block in response to a trigger condition.

Means for calculating, dynamically, a read voltage threshold shift for a last programmed word line (e.g., a boundary word line storage cell 302) based on a determined read voltage threshold for the last programmed word line (e.g., the boundary word line storage cell 302) and a baseline read voltage threshold include, in various embodiments, may include one or more of a voltage determination component 150, a voltage shift component 506, a controller 126, a die controller 220, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for calculating, dynamically, a read voltage threshold shift for the last programmed word line (a boundary word line storage cell 302) based on the determined read voltage threshold for the last programmed word line (the boundary word line storage cell 302) and a baseline read voltage threshold.

Means for reading data from a last programmed word line based on a read voltage threshold shift for the last programmed word line, in various embodiments, may include one or more of a sense amplifier 250, a voltage determination component 150, a voltage shift component 506, a controller 126, a die controller 220, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for reading data from a last programmed word line based on a read voltage threshold shift for the last programmed word line.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

What is claimed is:

1. An apparatus comprising:
an array of non-volatile memory cells; and
a controller configured to:
detect a trigger condition associated with a last programmed word line of a partially programmed erase block of the array of non-volatile memory cells, the last programmed word line comprising programmed non-volatile memory cells that are adjacent to programmed non-volatile memory cells and unprogrammed non-volatile memory cells of the array, the trigger condition comprising detecting that a predetermined amount of time has passed since the read voltage threshold shift for the last programmed word line was determined;
determine a read voltage threshold only for use with the last programmed word line of the partially programmed erase block in response to the trigger condition; and
calculate, dynamically, a read voltage threshold shift only for use with the last programmed word line based on the determined read voltage threshold for the last programmed word line and a baseline read voltage threshold.

2. The apparatus of claim 1, wherein the trigger condition comprises determining that an error rate for the last programmed word line satisfies a predetermined error rate threshold for the last programmed word line.

3. The apparatus of claim 1, wherein the trigger condition comprises determining that a temperature associated with the last programmed word line satisfies a predetermined temperature threshold for the last programmed word line.

4. The apparatus of claim 1, wherein the trigger condition comprises determining that a number of read operations performed on the last programmed word line satisfies a predetermined read operation threshold for the last programmed word line.

5. The apparatus of claim 1, wherein the controller is further configured to determine the read voltage threshold for the last programmed word line by:
reading data from the last programmed word line using a first read voltage threshold, the first read voltage threshold different than a default read voltage threshold for the last programmed word line; and
adjusting the first read voltage threshold using one or more error correction code words to determine the boundary between states for the last programmed word line, the determined read voltage threshold comprising the read voltage threshold at the boundary.

6. The apparatus of claim 1, wherein the controller is further configured to:
determine a string position of a memory cell comprising the last programmed word line; and
determine thresholds for detecting the trigger condition for the last programmed word line based on the determined string position of the memory cell.

7. The apparatus of claim 1, wherein the controller is further configured to determine the baseline read voltage threshold by referencing predetermined read voltage thresholds of one or more programmed memory cells that do not comprise the last programmed word line.

8. The apparatus of claim 1, wherein the controller is further configured to determine the baseline read voltage threshold by sampling, dynamically, read voltage thresholds of one or more programmed memory cells of the partially programmed erase block.

9. The apparatus of claim 1, wherein the controller is further configured to determine the baseline read voltage threshold by sampling, dynamically, read voltage thresholds of one or more programmed memory cells of a corresponding fully-programmed erase block.

10. The apparatus of claim 1, wherein the controller is further configured to generate one or more reference tables of calculated voltage shifts, the one or more reference tables comprising voltage shifts for last programmed word lines of one or more of:
a string of memory cells;
a group of strings of memory cells;
an erase block; and
a group of erase blocks.

11. The apparatus of claim 10, wherein the controller is further configured to include the determined read voltage thresholds for the last programmed word line in the one or more reference tables.

12. The apparatus of claim 1, wherein the array of non-volatile memory cells comprises vertical strings of memory cells of a 3D NAND flash memory device.

13. A method comprising:
- determining a read voltage threshold only for use with a last programmed word line of a partially programmed erase block of an array of non-volatile memory cells in response to detecting a trigger condition associated with the last programmed word line, the last programmed word line comprising programmed non-volatile memory cells that are adjacent to programmed non-volatile memory cells and unprogrammed non-volatile memory cells of the array;
- determining a baseline read voltage threshold by one or more of:
  - referencing predetermined read voltage thresholds of one or more programmed memory cells that do not comprise the last programmed word line;
  - sampling, dynamically, read voltage thresholds of one or more programmed memory cells of the partially programmed erase block; and
  - sampling, dynamically, read voltage thresholds of one or more programmed memory cells of a corresponding fully-programmed erase block;
- calculating, dynamically, a read voltage threshold shift only for use with the last programmed word line based on the determined read voltage threshold for the last programmed word line and the baseline read voltage threshold; and
- reading data from the last programmed word line using the determined read voltage threshold based on the read voltage threshold shift.

14. The method of claim 13, wherein the trigger condition comprises one or more of:
- detecting that a predetermined amount of time has passed since the read voltage threshold shift for the last programmed word line was determined;
- determining that an error rate for the last programmed word line satisfies a predetermined error rate threshold for the last programmed word line;
- determining that a temperature associated with the last programmed word line satisfies a predetermined temperature threshold for the last programmed word line; and
- determining that a number of read operations performed on the last programmed word line satisfies a predetermined read operation threshold for the last programmed word line.

15. The method of claim 13, further comprising determining the read voltage threshold for the last programmed word line by:
- reading data from the last programmed word line using a first read voltage threshold, the first read voltage threshold different than a default read voltage threshold for the last programmed word line; and
- adjusting the first read voltage threshold using one or more error correction code words to determine the boundary between states for the last programmed word line, the determined read voltage threshold comprising the read voltage threshold at the boundary.

16. The method of claim 13, further comprising:
- determining a string position of a memory cell comprising the last programmed word line; and
- determining thresholds for detecting the trigger condition for the last programmed word line based on the determined string position of the memory cell.

17. The method of claim 13, further comprising generating one or more reference tables of calculated voltage shifts, the one or more reference tables comprising voltage shifts for last programmed word lines of one or more of:
- a string of memory cells;
- a group of strings of memory cells;
- an erase block; and
- a group of erase blocks.

18. An apparatus comprising:
- means for detecting a trigger condition associated with a last programmed word line of a partially programmed erase block of an array of non-volatile memory cells, the last programmed word line comprising programmed non-volatile memory cells that are adjacent to programmed non-volatile memory cells and unprogrammed non-volatile memory cells of the array, the trigger condition comprising detecting that a predetermined amount of time has passed since the read voltage threshold shift for the last programmed word line was determined;
- means for determining a read voltage threshold only for use with the last programmed word line of the partially programmed erase block in response to the trigger condition;
- mean for calculating, dynamically, a read voltage threshold shift only for use with the last programmed word line based on the determined read voltage threshold for the last programmed word line and a baseline read voltage threshold; and
- means for reading data from the last programmed word line based on the read voltage threshold shift for the last programmed word line.

19. The apparatus of claim 18, further comprising means for determining a baseline read voltage threshold by one or more of:
- referencing predetermined read voltage thresholds of one or more programmed memory cells that do not comprise the last programmed word line;
- sampling, dynamically, read voltage thresholds of one or more programmed memory cells of the partially programmed erase block; and
- sampling, dynamically, read voltage thresholds of one or more programmed memory cells of a corresponding fully-programmed erase block.

20. A method, comprising:
- determining a string position of a memory cell comprising a last programmed word line of a partially programmed erase block of an array of non-volatile memory cells, the last programmed word line comprising programmed non-volatile memory cells that are adjacent to programmed non-volatile memory cells and unprogrammed non-volatile memory cells of the array;
- determining thresholds for detecting a trigger condition for the last programmed word line based on the determined string position of the memory cell;
- determining a read voltage threshold only for use with the last programmed word line in response to detecting a trigger condition, based on the determined thresholds, associated with the last programmed word line;
- calculating, dynamically, a read voltage threshold shift only for use with the last programmed word line based on the determined read voltage threshold for the last programmed word line and a baseline read voltage threshold; and
- reading data from the last programmed word line using the determined read voltage threshold based on the read voltage threshold shift.

* * * * *